United States Patent [19]

Faris et al.

[11] Patent Number: 4,809,133
[45] Date of Patent: Feb. 28, 1989

[54] LOW TEMPERATURE MONOLITHIC CHIP

[75] Inventors: Sadeg M. Faris, Pleasantville; Gert K. G. Hohenwarter, Tarrytown; Stephen R. Whiteley, Shrub Oak, all of N.Y.

[73] Assignee: Hypres, Inc., Elmsford, N.Y.

[21] Appl. No.: 913,108

[22] Filed: Sep. 26, 1986

[51] Int. Cl.$^4$ .............................................. H05K 7/20
[52] U.S. Cl. ................................... 361/385; 174/15.4; 357/83
[58] Field of Search ................. 165/80.4; 174/15 CA, 174/15 R; 357/82.5, 83; 361/382, 385, 386, 398, 400; 505/832, 861, 864, 878, 885, 899, 900–901

[56] References Cited

U.S. PATENT DOCUMENTS

| | | | |
|---|---|---|---|
| 3,560,893 | 2/1971 | Wen | 333/24.1 |
| 3,644,803 | 2/1972 | Levi | 317/235 R |
| 4,190,106 | 2/1980 | Dunmire et al. | 165/185 |
| 4,314,117 | 2/1982 | Ditzig | 361/398 |
| 4,374,457 | 2/1983 | Wiech, Jr. | 361/382 |
| 4,441,088 | 4/1984 | Anderson | 333/1 |
| 4,450,693 | 5/1984 | Green et al. | 62/514 R |
| 4,459,823 | 7/1984 | Josephs et al. | 62/268 |
| 4,498,046 | 2/1985 | Faris et al. | 324/158 F |
| 4,587,719 | 5/1986 | Barth | 361/398 |

OTHER PUBLICATIONS

C. A. Hamilton, "High-Speed, Low-Crosstalk Chip Holder for Josephson Integrated Circuits", IEEE Transactions on Instrumentation and Measurement, vol. IM-31, No. 2, Jun., 1982.
C. A. Hamilton, et al., "Analog Measurement Applications for High Speed Josephson Switches", IEEE Transactions on Magnetics, vol. MAG-17, No. 1, Jan., 1981.
Seifert, H., "Liquid Helium Cooled Sample Stage for Scanning Electron Microscope", Jul. 15, 1982.
Moskowitz, P. A., et al., "Cryosampler Interface", IBM Research Report, RC 9614 (#42408), 10/1/82.
Moskowitz, P.A., et al., "Superconducting Electronics Testing", IBM Research Report, RC 9519 (#42090), 8/18/82.
Shirshov, et al., "1 KA Current Lead-Ins for Superconducting Solenoids Operating in Transportable Dewar Vessel", Institute of High-Energy Physics, Serpukhov, pp. 1336-1338, Plenum Publishing Corp. 1982 (translated from Pribory i Tekhnika Eksperimenta, No. 5, pp. 220-221, Sep.–Oct. 1981; original article submitted Sep. 19, 1980).
"IBM Journal of Research and Development", vol. 24, No. 2, pp. 105-264, Mar. 1980.

Primary Examiner—A. D. Pellinen
Assistant Examiner—Gregory D. Thompson
Attorney, Agent, or Firm—Kenyon & Kenyon

[57] ABSTRACT

A monolithic chip is described which is suited for a superconductive device. The chip includes a substrate with high and low temperature region, a superconductive device formed on the low temperature region and various lines for transmitting signals between the device and the high temperature region. Various configurations are described for optional separation of the high and low temperature region as well as high and low bandwidth signal lines. Chips with various geometric substrates are also described.

15 Claims, 2 Drawing Sheets

LOW TEMPERATURE MONOLITHIC CHIP

RELATED APPLICATIONS

The subject matter of this application is related to the U.S. Pat. No. 4,739,633 to Faris, entitled "Room Temperature to Cryogenic Electrical Interface." The subject matter of this application may also be related to U.S. Pat. No. 4,715,189 to Hohenwarter, entitled "Open Cycle Cooling of Electrical Circuits".

BACKGROUND OF THE INVENTION a. Field of Invention

This invention pertains to a superconductive monolithic chip having an active electronic circuit which is operational when it is below a critical temperature, such as a Josephson junction based circuit, and conductors for coupling the circuit to the outside world.

b. Description of the Prior Art

The use of low temperature or superconductive electrical circuits having such elements as Josephson switching devices has become widespread in various fields where very high speeds (in the order of pico- and subpico-seconds) and low energy levels are prevalent. In all these fields, the Josephson switching circuit is used as one element of a system with other elements being at ambient temperatures.

Any interfacing scheme between the superconductive device and other circuits at ambient temperatures must take into consideration the following constraints:

ELECTRICAL CONSTRAINTS

When operating at high frequencies and extremely short pulse durations, any power lost in the transmission line between the low temperature circuit and the room temperature circuit will degrade the signal transfer. This degradation appears as pulse dispersion or pulse spreading. To minimize loss, the transmission lines should be made of a low resistance material, be as short as possible, and have the largest possible cross sectional area. The latter constraint is limited by the further constraint that the width of the transmission line should not exceed the wavelength of the maximum frequency of interest, because larger conductors will waveguide and cause geometric losses.

MECHANICAL CONSTRAINTS

Since one end of the transmission line will be operating at extremely low temperatures and the other end will be operating at room temperatures, it is important that the transmission line be able to withstand that temperature difference. Thus, the bond between the transmission line and the low temperature device should be able to withstand that low temperature, and the seal through which the transmission line passes between the low temperature volume and the room temperature volume should also be able to withstand the necessary temperatures. These elements should also be able to withstand repeated cycling from room temperature to low temperature for maintenance, replenishment of helium supply, and general everyday use. Additionally, the temperature coefficient of expansion of the transmission lines should closely match that of the low temperature device, and the construction should be such as to permit the apparatus to tolerate vibration and temperature-induced changes in transmission line length (collectively referred to herein as "movement").

TEMPERATURE CONSTRAINTS

In order to prevent extensive heat transfer from the room temperature volume to the low temperature volume, the transmission lines should be as long as possible. This is directly contrary to the electrical constraints which favor short transmission lines. The transmission lines should also be made of a material which has low thermal conductivity. Since low thermal conductivity usually implies low electrical conductivity, this constraint, too, is contrary to the electrical constraints.

Workers in the field of superconducting electronics typically achieve the necessary temperatures by immersing their circuits in liquid helium. See, for example, Hamilton, "High-Speed, Low-Crosstalk Chip Holder for Josephson Integrated Circuits," IEEE Trans. on Instrumentation and Measurement, Vol. IM-31, pp. 129-131 (1982). The arrangement shown therein involves attaching several coaxial cables to a Josephson Junction chip which is to be immersed in a liquid helium dewar. See also Hamilton et al., IEEE Transactions on Magnetics, MAG-17, pp. 577-582 (1981), in which a low-temperature chip is inserted partially inside a coaxial line to couple the signals therethrough to the room-temperature devices. Although not mentioned in the reference, it is believed that the low-temperature chip is then immersed in liquid helium. Both arrangements are constrained to have large coaxial lines which have high thermal conductivity. In order to avoid heat losses, the lines are therefore constrained to be long. In addition, these arrangements cannot be adapted easily to planar chips. Furthermore, at least the latter system is constrained to couple only one line to a chip, which limits the system in utility.

An attempt to deal with the constraints described above appears in U.S. Pat. No. 4,498,046 to Faris. The interface described therein includes a pass-through liquid-helium-tight vacuum seal which consists of a flange and two half-cylindrical fused quartz portions, unequal in length, which act as a pass-through plug from a liquid-helium filled cryostat to a vacuum chamber. Fused quartz, while thermally non-conductive, forms a low loss dielectric substrate for conductive copper striplines which are patterned on the flat surface of the longer portion. The coefficient of expansion of fused quartz is small and relatively well matched to that of silicon, which is used for Josephson and semiconductor chip substrates.

The two fused quartz half-cylinder portions of the pass-through plug are arranged so that the portion with the copper striplines extends sufficiently beyond its mating half-cylinder portion on both ends to provide two platforms at opposite ends of the plug. The low temperature semiconductor chip or device is mounted on one of these platforms and the room temperature chip or device is mounted on the other. The cylindrical geometry was chosen in order to minimize stress on cement used to seal the chamber wall around the pass-through. The planar nature of the striplines allows low inductance connections to be made directly to the two chips which are also planar. The low inductance contacts are copper spheres or other rigid probes, about 100 um in diameter or smaller, which penetrate solder pads on the chips when forced into contact by mechanical pressure. The wall of the cryostat is sealed around the pass-through with a thin layer of non-conductive cement. In operation, the two chips are mounted on the platforms and the pass-through is inserted through the crystat wall such that the low temperature chip is immersed in liquid helium in the cryostat and the room temperature chip is disposed inside the vacuum chamber. A heating element and thermocouple are placed near the position of the room temperature chip in order to warm it. This chamber must be evacuated in order to prevent frosting of water and other gases on the plug, and also to provide adequate insulation for the cryostat.

The U.S. Pat. No. 4,498,046 apparatus has numerous problems which render it costly, unreliable and impractical to use in most applications. First, the only method described in the U.S. Pat. No. 4,498,046 patent for cooling the low temperature device involves immersing it in liquid helium. It is advantageous, however, to be able to cool such devices using a closed cycle refrigerator (CCR), which is a refrigeration device that is complete unto itself, and is simply plugged into an ordinary AC wall socket.

Second, the apparatus requires at least two seals, one between the cryostat and the vacuum chamber, and one between the vacuum chamber and the external environment. At least the first of these seals is extremely difficult to create, because it must operate at cryogenic temperatures, must be able to be cycled many times between cryogenic and room temperatures, and must be able to withstand a certain amount of vibration without breaking. Due to the small size of the helium atom, it can pass through extremely small cracks in the seal and can even pass through most materials which are not cracked. This severely limits the types of seals which can be used.

Third, since the low temperature chip is fabricated on a silicon substrate and the transmission line is fabricated on a fused quartz substrate, the two elements must usually be made separately and then mechanically and electrically bonded together. These additional steps are costly. In addition, even though their respective temperature coefficients of expansion are close, the mere fact that the materials are different requires some mismatch which degrades the electrical connection and the mechanical reliability of the bond.

Fourth, because multiple sealed layers of chambers and insulating material are required, the transmission line which carries electrical signals between the two chips must be very long.

Fifth, the pass-through of the U.S. Pat. No. 4,498,046 apparatus has to be cylindrical in order to obtain a good seal. This renders it difficult to manufacture, and requires special geometries such as that shown in FIG. 3E of the U.S. Pat. No. 4,498,046.

Finally, the chips used in the U.S. Pat. No. 4,498,046 apparatus cannot be easily plugged in or out in order to change them.

SUMMARY OF THE INVENTION

It is an objective of the present invention to provide an effective means of interfacing a low temperature device with ambient temperature circuits by providing a monolithic chip with one portion which may be cooled to superconductive temperatures and another portion which may be at ambient temperature, with interfacing transmission lines thereon.

A further objective is to provide several configurations for the interface suitable for various applications.

Yet another objective is to provide a chip which may be cooled to superconductive temperatures in much less space than required for the prior art.

Other objectives and advantages of the invention will become apparent from the following description of the invention.

In a preferred embodiment of the invention, the monolithic chip comprises a substrate having a central low temperature region and a surrounding high temperature region; a low temperature device formed on said low temperature region; and a plurality of transmission lines formed on the substrate which couple to said device and extend into the high temperature region.

In the above mentioned U.S. Pat. No. 4,739,633, a monolithic chip is disclosed which comprises an elongated substrate having a low temperature device at one end corresponding to a low temperature region and a plurality of transmission lines (including high and low performance or bandwidth lines) coupled to the circuit and traversing the substrate longitudinally to the other end disposed in a high temperature region of the substrate. The device and the lines are formed on the substrate by known integrated circuit techniques. The chip may be positioned with the low temperature region either in a cooling vessel (as disclosed in U.S. Pat. No. 4,739,633) or in a low temperature fluid flow (as disclosed in U.S. Pat. No. 4,715,189) with the other end extending into an ambient temperature zone for standard connections to other circuits.

Advantageously, the monolithic chip of the present invention can facilitate the inventive cooling systems of the above related patents. The monolithic chip carries both the superconductive device and the lines connected thereto to satisfy the interfacing constraints described above. The chip can be made relatively small (in the order of 1–2.5 cm) to limit power losses and signal degradation. The chip substrate provides good thermal isolation to minimize heat transfer to the device, and is tolerant of mechanical vibrations, as well as cyclical temperature changes.

In the present invention further configurations for the chip provide jointly or alternatively for a chip with a central low temperature region, a chip in which a separation is made between the low and high temperature regions, a chip providing a separation between the low and high bandwidth transmission lines, as well as a triangular or rectangular chip with a superconductive circuit formed in a corner of the substrate.

DETAILED DESCRIPTION OF THE INVENTION

Figure 1:
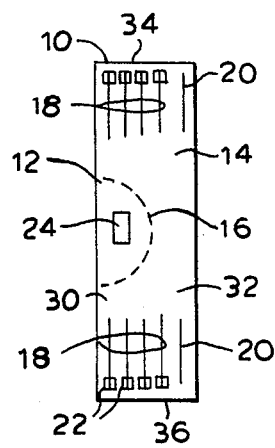
FIGS. 1 and 2 shows a first embodiment of a monolithic chip constructed in accordance with the invention, wherein the electronic device is disposed in a central low temperature area of an elongated substrate.

In the various configurations shown in the Figures, the chips have the same elements, namely, a substrate 10 partitioned into a low temperature region 12 and a high temperature region 14 by an imaginary line 16, with a plurality of low bandwidth transmission lines 18 and high bandwidth transmission lines 20 and a superconductive device 24 formed on the substrate. Line 16 is shown to arbitrarily separate the two regions and to indicate which region of the substrate is cooled. Of course, physically such a line is not necessary. The low bandwidth lines 18 are connected directly to the superconductive device 24 and may be terminated in contacting pads 22 for connection to other circuits by soldering. The high bandwidth lines 20 are connected directly to the superconductive device 24 and by a high bandwidth bond to other circuits at ambient (room) temperature.

The high bandwidth lines 20 are used to transmit the signals that are being modulated by the circuit or device 24 and may have a range from D.C. to 100 gigahertz. The low bandwidth lines 18 are used to provide biasing and monitoring signals for the circuit. It should be understood that all the transmission lines 18, 20 are electrically connected to device 24 by connecting links which have been omitted for clarity.

Figure 2:
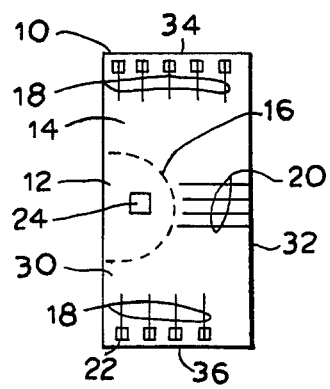

Turning now to the Figures, in the first embodiment of FIGS. 1 and 2, the substrate 10 is generally rectangular with two lengthwise edges 30, 32. The low temperature circuit 24 is disposed adjacent one of the edges, about mid-way between the longitudinally opposed ends 34 and 36. In the configuration of FIG. 1, lines 18 and 20 are laid out generally in parallel and extend towards one or both opposed ends 34, 36.

In the configuration of FIG. 2, only the low bandwidth lines 18 extend towards one or both opposed ends 34, 36. The high bandwidth lines 20 extend transversally from device 24 toward the other lengthwise edge 32.

Figure 3:
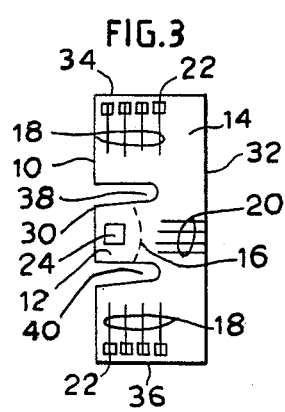
FIGS. 3 and 4 show a second embodiment of a monolithic chip constructed in accordance with the invention wherein the low and high temperature regions are physically separated.
Figure 4:
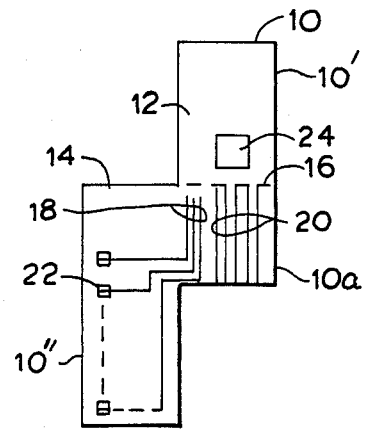

Substrate 10 is made of a material with a very low thermal conductivity (such as fused quartz) to minimize heat transfer from the high temperature region to the low temperature region. To reduce this heat transfer even further, the embodiment of FIGS. 3 and 4 illustrates that the two regions can be at least partially physically separated. In the configuration of FIG. 3, the substrate is similar in shape to the one shown in FIG. 2 but has two slots 38, 40 extending transversely from the lengthwise edge 30 thereby partially separating region 12 from region 14.

In the configuration of FIG. 4, the substrate is generally Z-shaped and has two lobes 10' and 10" connected by narrow neck 10a. The superconductive circuit 24 is formed on lobe 10' and the low temperature region does not overlap lobe 10". Thus a large surface area is provided for connection pads 22.

Figure 5:
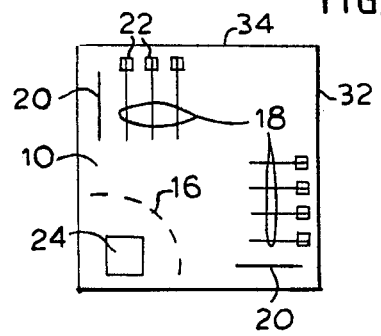
FIGS. 5 and 6 show a third embodiment of a monolithic chip constructed in accordance with the invention wherein the substrate is rectangular with the electronic device disposed in a corner.
Figure 6:
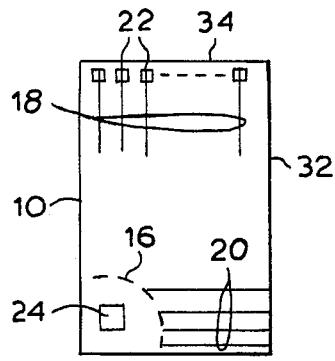

In the embodiment of FIGS. 5 and 6, the substrate is either rectangular (FIG. 6) or square (FIG. 5) and the device 24 is formed at one of the corners. Both the low and the high transmission lines 18, 20 may extend from the device towards both opposite edges 32, 34 (FIG. 5). Alternatively, the low bandwidth lines 18 may extend toward one of the edges 34, while the high bandwidth lines 20 may extend toward the other edge 32 (FIG. 6).

Figure 7:
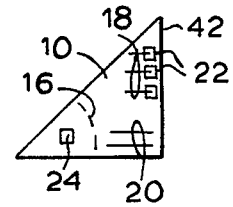
FIGS. 7 and 8 show a fourth embodiment of a monolithic chip constructed in accordance with the invention wherein the substrate is triangular.
Figure 8:
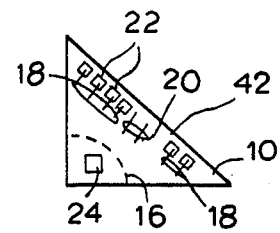

FIGS. 7 and 8 show an embodiment with a triangular substrate 10. The device 24 may be placed at an acute corner of the triangle as in FIG. 7. In case of the right triangle, the device may be placed at the right angle corner (FIG. 8). In either configuration the transmission lines preferably extend from the device toward the opposite edge 42.

Figure 9:
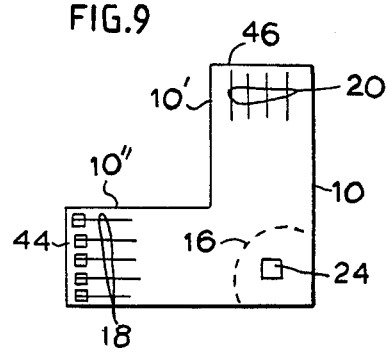
FIGS. 9 and 10 show a fifth embodiment of a monolithic chip constructed in accordance with the invention wherein a separation is provided between the high and low bandwidth transmission lines.
Figure 10:
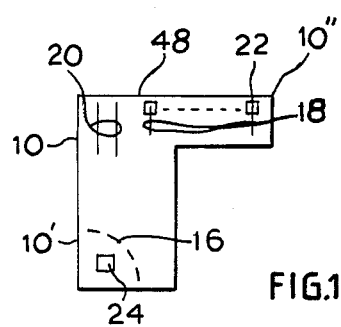

The embodiment of FIGS. 9 and 10 is suited for separating the high and the low bandwidth transmission lines. The substrate 10 is generally L-shaped with two lobes 10', 10" being generally normal to each other. In the configuration of FIG. 9, the device 24 is formed at the common corner as shown. The lobes have respective end edges 44, 46. Low bandwidth lines 18 extend from the device 24 to edge 44, while the high bandwidth lines 20 extend to the other edge 46.

In the configuration of FIG. 10, device 24 is formed at one of the corners of lobe 10'. The other lobe 10" has a relatively long edge 48 opposite device 24. The low and high bandwidth lines extend from the device and are spaced along the long edge 48.

Obviously numerous modifications can be made to the invention without departing from its scope as defined in the appended claims. It is possible, for example, to combine some of the configurations.

We claim:
1. A monolithic chip comprising:
    (a) an elongated substrate having two opposed ends, a high temperature region corresponding to said ends and a low temperature region disposed between said ends;
    (b) an electronic device formed on said low temperature region which is operative when its temperature is below a critical level; and
    (c) a plurality of conductive transmission lines formed on said substrate, said lines being connected to said device and extending into said high temperature region.

2. The chip of claim 1 wherein said substrate has first and second longitudinal edges, said device being formed adjacent to said first longitudinal edge.

3. The chip of claim 2 wherein said transmission lines include high and low bandwidth transmission lines extending from said device toward said ends.

4. The chip of claim 2 wherein said transmission lines include high bandwidth transmission lines extending toward said second edge, and low bandwidth transmission lines extending toward at least one of said ends.

5. A monolithic chip comprising:
    (a) a substrate having a low temperature region and a high temperature region at least partially physically separated from the low temperature region to reduce thermal transfer to the low temperature region;
    (b) an electronic device formed on said low temperature region which is operative when its temperature is below a critical value; and
    (c) a plurality of conductive transmission lines formed on the substrate, said lines being connected to said device and extending into said high temperature region.

6. The chip of claim 5 wherein said substrate is elongated and has two opposed ends corresponding to said high temperature region, said low temperature region being at least partially physically separated from the high temperature region by at least one slot.

7. The chip of claim 5 wherein said substrate is generally Z-shaped and has lobes connected by a narrow neck, said device being formed on one of said lobes.

8. A monolithic chip comprising:

(a) a substrate with a corner and at least one edge opposing said corner, said substrate including a low temperature region corresponding to said corner and a high temperature region corresponding to said at least one edge;
(b) an electronic device formed adjacent to said corner in said low temperature region, said device being operative when its temperature is below a critical level; and
(c) a plurality of conductive transmission lines formed on said substrate, said lines being connected to said device and extending into said high temperature region.

9. The chip of claim 8 wherein said transmission lines include high bandwidth and low bandwidth transmission lines extending toward said at least one edge.

10. The chip of claim 9 wherein said substrate is triangular.

11. The chip of claim 9, wherein said substrate has a second edge opposing said corner.

12. The chip of claim 11 wherein said low bandwidth transmission lines extend toward said one edge and said high bandwidth transmission lines extend toward said second edge.

13. A monolithic chip comprising:
(a) a substrate having a high temperature and a low temperature region;
(b) an electronic device formed on said low temperature region and being operative when its temperature is below a critical level; and
(c) a plurality of high bandwidth transmission lines formed on said substrate, said lines being connected to said device and extending into said high temperature region; and
(d) a plurality of low bandwidth transmission lines formed on said substrate, said lines being connected to said device and extending into said high temperature region; said high temperature region being shaped so as to form two sub-regions and to separate said low and high bandwidth lines which each extend into a respective sub-region.

14. The chip of claim 13 wherein said substrate is generally L-shaped, having first and second lobes with corresponding first and second edges; and a common corner; said device being formed adjacent said corner, and said high and low bandwidth transmission lines extending toward said first and second edges respectively.

15. The chip of claim 13 wherein said substrate is generally L-shaped with two lobes, one of said lobes having a corner, and the other lobe having an edge opposing said corner; said device being disposed at said corner, and said lines extending toward said edge.

* * * * *